(12) United States Patent
Kodama et al.

(10) Patent No.: US 6,627,335 B2
(45) Date of Patent: Sep. 30, 2003

(54) COATED CUTTING TOOL AND METHOD FOR PRODUCING THE SAME

(75) Inventors: Hiroyuki Kodama, Kanagawa (JP); Nobukazu Yoshikawa, Kanagawa (JP); Itsuo Yazaki, Kanagawa (JP)

(73) Assignee: Toshiba Tungaloy Co., Ltd., Kawasaki (JP)

( * ) Notice: Subject to any disclaimer, the term of this patent is extended or adjusted under 35 U.S.C. 154(b) by 118 days.

(21) Appl. No.: 09/821,089

(22) Filed: Mar. 30, 2001

(65) Prior Publication Data

US 2001/0036388 A1 Nov. 1, 2001

(30) Foreign Application Priority Data

Mar. 30, 2000 (JP) .................................. 2000-094464

(51) Int. Cl.$^7$ ........................... B23B 27/14; B23P 15/28
(52) U.S. Cl. ........................... 428/698; 51/295; 51/307; 51/309; 407/118; 407/119; 428/325; 428/472
(58) Field of Search ............................... 428/698, 325, 428/472; 407/119; 51/295, 307, 309

(56) References Cited

U.S. PATENT DOCUMENTS

| | | | | |
|---|---|---|---|---|
| 5,786,069 | A | * | 7/1998 | Ljungberg et al. |
| 5,912,051 | A | * | 6/1999 | Olsson et al. |
| 5,915,162 | A | * | 6/1999 | Uchino et al. |
| 6,062,776 | A | * | 5/2000 | Sandman et al. |
| 6,183,846 | B1 | * | 2/2001 | Moriguchi et al. |
| 6,187,421 | B1 | * | 2/2001 | Moriguchi et al. |
| 6,261,673 | B1 | * | 7/2001 | Reineck et al. |

FOREIGN PATENT DOCUMENTS

| | | | |
|---|---|---|---|
| EP | 0 443 659 | | 8/1991 |
| EP | 0 653 499 | | 5/1995 |
| JP | 08-071814 | * | 3/1996 |
| JP | 09-225705 | * | 9/1997 |
| JP | 10-015711 | * | 1/1998 |
| JP | 10-109206 | * | 4/1998 |
| JP | 10-147831 | * | 6/1998 |
| JP | 11-269649 | * | 10/1999 |
| JP | 2001-341007 | * | 12/2002 |

OTHER PUBLICATIONS

Chatterjee–Fischer et al., "Medium Temperature CVD for Coating Steel Parts", Advanced Materials & Processes, America Society for Metals. Metals Park, Ohio, US, vol. 129, No. 2, Feb. 1986, pp. 35–38 & 43, XP 002141639.

* cited by examiner

*Primary Examiner*—Archene Turner
(74) *Attorney, Agent, or Firm*—Foley & Lardner

(57) ABSTRACT

There are disclosed a coated cutting tool which comprises a base material of a hard alloy comprising a hard phase of tungsten carbide and at least one material selected from a carbide, nitride and carbonitride of a metal selected from the Group 4, 5 and 6 of the Periodic Table and a mutual solid solution thereof and a binder phase of at least one element selected from Fe, Ni and Co, and a hard coating film formed on the surface of the base material by a CVD method, wherein the hard coating film has a columnar crystal layer comprising at least one material selected from a carbide, nitride and carbonitride of titanium, the columnar crystal layer contains large-sized particles and small-sized particles, and the ratio of the amounts of the large particles to the small particles is 3 to 50; and a method for producing the same which comprises forming the hard coating film by at least one coating film of a carbide, carbonitride and carbonitroxide of titanium using a hydrocarbon gas containing ethane as a carbon element-feeding gas.

8 Claims, No Drawings

COATED CUTTING TOOL AND METHOD FOR PRODUCING THE SAME

BACKGROUND OF THE INVENTION

1. Field of the Invention

The present invention relates to a cutting tool formed by coating a substrate such as hard metal, cermet or ceramic with a hard coating film, which has improved cutting ability due to the co-presence of particles having particle diameters in a direction horizontal to the base material is large and particles having particle diameters in the same direction are small in a columnar crystal layer and the presence of agglomerations dispersed in the columnar crystal layer, and a method for producing the same.

2. Prior Art

A variety of coating techniques for forming a hard layer on a cutting tool or the like have been practiced. In recent years, a technique relating to a columnar crystal structure of the coating film which comprises titanium compounds has been developed, and an invention relating to particle diameters thereof has been disclosed. For example, Japanese Patent Application Laid-Open No. 285001/1995 discloses an invention in which the average crystal particle diameter of columnar crystals is limited to 0.1 to 1 $\mu$m when the film thickness of TiCN is not larger than 4 $\mu$m and the average crystal particle diameter is limited to 0.5 to 3 $\mu$m when the film thickness of TiCN is 4 to 20 $\mu$m. Japanese Patent Application Laid-Open No. 71814/1996 discloses an invention in which columnar crystals have a tapered shape, the average crystal particle diameter is 0.012 to 0.5 $\mu$m when the film thickness is not larger than 2 $\mu$m, and the average crystal particle diameter is 0.05 to 1.3 $\mu$m when the film thickness is 2 to 10 $\mu$m. Japanese Patent Application Laid-Open No. 15711/1998 discloses an invention in which the average particle diameter in a horizontal direction is 0.3 to 1.2 $\mu$m, the average particle diameter in a vertical direction is at least 2.5 times that in the horizontal direction, and the thickness of columnar crystal layer comprising TiCN corresponds to at least 60% of the total thickness of the film. Japanese Patent Application Laid-Open No. 109206/1998 discloses an invention in which the average particle diameter of particles in the columnar crystal layer changes depending on the position from the interface and the average crystal particle diameter is 0.15 to 1.5 $\mu$m.

In prior art, it is provided that the columnar crystals in the columnar crystal layer have uniform particle diameters in a direction horizontal to the interface between the coating film and the base material in the same plane as described in Japanese Patent Application Laid-Open No. 285001/1995, and the average particle diameter and the range of the particle diameters of the columnar crystals, e.g., TiCN, are limited.

Further, in Japanese Patent Application Laid-Open Nos. 71814/1996, 15711/1998 and 109206/1998, there has been disclosed an invention in which the particle diameters of columnar crystals in the same plane are uniform while the particle diameters of columnar crystals change in a thickness direction.

The columnar crystals in the same plane have a uniform particle diameter in these inventions, so that there is a problem that they are liable to have cracks caused by thermal shock whereas abrasion resistance is excellent.

In the developments of the conventional coated hard metal cutting tools, abrasion resistance has been considered extremely important in terms of cutting capability so that the development of a technique for prolonging the useful life of a cutting tool by improving thermal shock resistance by controlling the columnar crystal structure has not been carried out.

SUMMARY OF THE INVENTION

Therefore, an object of the present invention is to overcome the above-mentioned problems and to provide a cutting tool having excellent cutting properties. The present invention has been achieved by conducting various experiments and studies with regard to the controls of the diameters of the columnar crystal particles and columnar crystal structure to solve the above problem.

That is, a coated cutting tool of the present invention comprises a base material of a hard alloy comprising a hard phase of tungsten carbide and at least one material selected from the group consisting of a carbide, a nitride and a carbonitride of a metal selected from the group consisting of the Group 4, 5 and 6 (IVa, Va and VIa) of the Periodic Table and a mutual solid solution thereof and a binder phase of at least one element selected from the group consisting of Fe, Ni and Co, and a hard coating film formed on the surface of the base material by a chemical vapor deposition (CVD) method, wherein the hard coating film has a columnar crystal layer comprising at least one material selected from the group consisting of a carbide, a nitride and a carbonitride of titanium, the columnar crystal layer contains particles having crystal particle diameters in a direction horizontal to the interface between the hard coating film and the base material are large and particles having crystal particle diameters in the same direction are small, and the ratio of the average particle diameter of the large particles to the average particle diameter of the small particles is 3 to 50.

Also, a method for producing the coated cutting tool of the present invention comprises forming a hard coating film by a chemical vapor deposition method on a surface of a hard metal base material of a hard alloy comprising a hard phase of tungsten carbide and at least one material selected from the group consisting of a carbide, a nitride and a carbonitride of at least one metal selected from the group consisting of the Group 4, 5 and 6 of the Periodic Table and a mutual solid solution thereof and a binder phase of at least one element selected from the group consisting of Fe, Ni and Co, wherein the hard coating film comprises at least one material selected from the group consisting of a carbide, a carbonitride and a carbonitroxide of titanium, and a hydrocarbon gas mainly comprising ethane is used as a carbon element-feeding gas for forming the hard coating film.

Here, the largest diameter is used as a representative value when the columnar crystal particles have a nearly circular shape. Also, when the columnar crystal particles have an oval shape having an aspect ratio of larger than 1.2, an average value of the particle diameter in a longitudinal direction and that in a direction perpendicular to the longitudinal direction is used as a representative value.

DESCRIPTION OF THE PREFERRED EMBODIMENTS

In the following, the present invention is explained in more detail.

The present invention has been completed by finding that thermal cracks are less liable to occur and a tool lasts longer when the structure of a coating film is a columnar crystal structure comprising large and small crystal particles than when it is a columnar crystal structure comprising crystal particles of the same particle diameter.

The base material of hard alloy to be used for the cutting tool according to the present invention comprises a hard phase and a binder phase. The hard phase of the hard alloy of the present invention comprises tungsten carbide as a main component and, as an auxiliary component, at least one material selected from the group consisting of carbides, nitrides and carbonitrides of a metal selected from the group consisting of the Group 4, 5 and 6 (IVa, Va and VIa) of the Periodic Table and mutual solid solutions thereof. The binder phase of the hard alloy comprises at least one element selected from the group consisting of Fe, Ni and Co. An amount of the binder phase is preferably 1 to 30% by weight based on the total amount of the hard alloy composition and the reminder is the hard phase. If an amount of the binder phase is less than 1% by weight, the resulting cutting tool is easily chipped off, while if it exceeds 30% by weight, wear resistance is markedly lowered. The hard alloy of the present invention can be prepared by the above materials by sintering with a powder metallurgy method under the conditions conventionally known in the art.

The hard coating film formed on the surface of the base material is formed by a chemical vapor deposition (CVD) method. Also, the hard coating film has a columnar crystal layer comprising at least one material selected from the group consisting of a carbide, a nitride and a carbonitride of titanium, and the columnar crystal layer contains particles having crystal particle diameters in a direction horizontal to the interface between the hard coating film and the base material are large and particles having crystal particle diameters in the same direction are small, and the ratio of the average particle diameter of the large particles to the average particle diameter of the small particles is 3 to 50.

In the present specification, the terms "the particles having crystal particle diameters in a direction horizontal to the interface between the hard coating film and the base material are large" mean particles having crystal particle diameters in the horizontal direction of preferably 0.4 to 10 $\mu$m. When it is smaller than 0.4 $\mu$m, an improvement in thermal shock resistance sometimes cannot be observed while when it is larger than 10 $\mu$m, a reduction in chipping resistance is sometimes incurred. Also, the terms "the particles having crystal particle diameters in a direction horizontal to the interface between the hard coating film and the base material are small" mean particles having crystal particle diameters in the horizontal direction of preferably 0.01 to 0.25 $\mu$m. When it is smaller than 0.01 $\mu$m, abrasion resistance sometimes lowers while when it is larger than 0.25 $\mu$m, a desired improvement in thermal shock resistance sometimes cannot be obtained.

Moreover, the thermal shock resistance is improved by the presence of agglomerations of large particles which are dispersed and apart from each other at a predetermined spacing in the coating film. Above all, a structure is desirable in which columnar crystal agglomerations of particles having large particle diameters are moderately dispersed among columnar crystals having small particle diameters. As a particle diameter of the dispersed agglomeration, the longest length in the agglomeration was used as a particle diameter.

It is preferred in the present invention that agglomerations having an average particle diameter of 2 to 200 $\mu$m are dispersed in the hard coating film. When the average particle diameter is smaller than 2 $\mu$m, a desired effect of improving thermal shock resistance cannot be observed in some cases while if it is larger than 200 $\mu$m, an effect expected by the co-presence of large and small particles sometimes cannot be obtained. As for the spacing between the agglomerations, it is preferably 0.5 to 200 $\mu$m because when it is smaller than 0.5 $\mu$m, the thermal shock resistance of the coating film is the same as a coating film containing particles having uniform particle diameter while if it is larger than 200 $\mu$m, the thermal shock resistance of the coating film is the same as a coating film containing fine particles having uniform particle diameter.

In addition to the above control of the columnar crystal particle diameters, it has also been found that the chipping resistance of the coated cutting tool is improved by providing a compressive residual stress of 30 to 80 kg/mm$^2$ to the hard phase of the coated base material. The columnar crystal particles have extremely excellent abrasion resistance, and particularly by controlling the crystal particles as in the present invention, high thermal shock resistance can be obtained. However, when the coating film becomes defective, the tool may become no longer usable due to the chippings in a cutting area subjected to particularly high shock. In such a case, by applying a compressive residual stress of 30 to 80 kg/mm$^2$ to the base material, particularly at a depth of about 200 $\mu$m from the interface between the coating film and the base material, a stress field changes, whereby the tool is protected from breakage caused by cracks in the coating film, with the result that high chipping resistance can be obtained.

When the residual compressive stress is less than 30 kg/mm$^2$, an improvement in chipping resistance sometimes cannot be observed. When it is 30 to 80 kg/mm$^2$, chipping resistance is improved almost in proportion to a residual stress value. When it is more than 80 kg/mm$^2$, the exfoliation of the coating film caused by the difference in residual stress between the coating film and the base material sometimes occurs. Therefore, the residual compressive stress is preferably set to be 30 to 80 kg/mm$^2$.

Next, the method for producing the coated cutting tool of the present invention is explained.

In a specific embodiment of the present invention, a hard metal having a desired shape is polished as required, washed and put in a thermochemical vapor deposition furnace based on chemical vapor deposition. When a coating film or layer is formed, a columnar crystal coating film comprising at least one material selected from the group consisting of a carbide, a carbonitride and a carbonitroxide of titanium is formed and a hydrocarbon gas comprising ethane as a main component is used as a carbon element-feeding gas out of gases charged into the furnace so as to obtain the columnar crystal structure of the present invention which comprises large and small crystal particles and has agglomerations dispersed therein.

The columnar crystal coating film or layer can be formed in a vacuum furnace at a temperature of about 900 to 930° C. and a vacuum degree in the vacuum furnace of about $1.0 \times 10^4$ to $5.0 \times 10^4$ Pa by introducing a gas comprising about 1 to 3 mol % of TiCl$_4$ as a titanium source, about $1.0 \times 10^{-2}$ to 5.0 mol %, preferably about $1.0 \times 10^{-2}$ to 3.0 mol % of ethane, about 40 to 80 mol % of N$_2$ as a nitrogen source of a carbonitride or a carbonitroxide, about 0 to 5.0 mol % of HCl and the reminder H$_2$ to carry out the CVD method. When a carbonitroxide of titanium is desired to be formed, a carbon monoxide gas is introduced with an optional amount.

The particle size of the columnar crystal film or layer can be controlled by a vacuum degree in the vacuum furnace to form the hard coating film. The film is formed with a low vacuum degree, the particle size becomes larger while it is formed with a high vacuum degree, the particle size becomes smaller. To mixedly present the large sized and small sized columnar crystal particles in the same coating film, it can be obtained by adding ethane as a source of feeding carbon in the introducing gas into the vacuum furnace. An amount of ethane in the introducing gas is preferably about 0.01 to 5.0 mol %, more preferably about 0.01 to 3.0 mol % based on the total amount of the gas to be introduced into the vacuum furnace. If it exceeds 5.0 mol %, extremely large sized grain is grown during grain growth step to cause lowering in strength of the cutting tool. If it is less than 0.01 mol %, only uniform particle sized columnar crystal can be obtained.

The structure of the coating film can also be controlled by mixing gases other than ethane into the carbon element-feeding gas. To state more specifically, at least one selected from methane, acetonitrile and propane is mixed into the gas. To further increase the proportion of large particles, propane and methane are preferably used. To further increase the proportion of small particles, acetonitrile is preferably used.

Also, to present dispersed agglomeration in the columnar crystal film, it can be obtained by dispesedly presenting cobalt on the surface of the base material before coating the hard film. On the surface of the base material, when cobalt is present, formation of nucleus is progressed at the region presenting cobalt so that columnar crystal having a fine particle size is likely formed. To the contrary, on the surface of the base material presenting no cobalt, columnar crystal having a large particle size is likely formed and this portion becomes an agglomerated part. Thus, by controlling an amount or a distribution frequency of cobalt on the surface of the base material, a diameter of the agglomeration and a distance of the same can be controlled. More specifically, cobalt on the surface of the base material can be exposed by the polishing treatment.

The application of the compressive residual stress to the base material is preferably carried out after the base material is coated, because the stress is liable to be lowered when it is applied before the coating film of the base material. The application of the residual stress may be carried out, for example, by ion implantation, shot peening or heat treatment.

The ion implantation cannot only apply the compressive residual stress by injecting ions into the coated tool from its surface at high speeds but also improve the adhesion of the coating film by a mixing effect at the interface of the base material. However, the injection is limited to a certain depth, and the ion implantation is suitable for applying the compressive residual stress at a depth of about several microns to 10 microns.

The shot peening is used to provide the compressive residual stress by plastic-deforming a very small area on the surface of the coated tool in very short time by spraying an air current or liquid containing hard particles of not larger than 1 mm and giving a shock to the area simultaneously. The hard particles are those of iron group metals such as hardened steel and carbon steel or ceramics such as alumina and zirconia. As for the shape of the particles, spherical or oval particles having no sharp edges are preferable because they are not liable to damage the tool.

The heat treatment applies the compressive residual stress to the surface of the tool by heating and quenching the tool. As for the heating temperature, the larger the temperature difference becomes, the larger a residual stress value gets. However, since an increase in the temperature difference also tends to cause the exfoliation of the coating film easily, the heating temperature is preferably 500 to 1,000° C.

Further, the compressive residual stress can also be applied by irradiating a laser beam to the extent that the coating film is not damaged. It is preferable to irradiate a laser beam particularly after the surface of the coating film is coated with a resin film such as a polyimide film, etc., because the coating film is hardly damaged.

In the process of applying the compressive residual stress, the ion implantation and the shot peening are more preferable because the chipping resistance of the tool can be further improved by relaxing the tensile residual stress caused by the thermal expansion coefficient difference of the coating film containing the columnar crystals. Of the two, the shot peening is more preferable since it can apply the compressive residual stress to the depths.

The particle diameters, in a direction horizontal to the interface of the base material, of the columnar crystals and the diameters of the agglomerations in the coating film of the coated cutting tool produced were evaluated by the following manner. A sample is mirror-finished in a direction parallel to the interface of the base material to the middle of the longitudinal direction of the columnar crystals. The surface of the mirror-finished TiCN columnar crystal film is etched by a solution comprising hydrofluoric acid, nitric acid and water. Since the crystalline interfaces of the columnar crystals are etched by priority, the structure of the crystals can be observed easily. The thus surface-treated sample is observed by a scanning electron microscope (SEM) to measure the particle diameters, in the direction horizontal to the interface of the base material, of the columnar crystals. Particularly, when the particle diameters of the columnar crystals are too small to be measured by the above method, the particle diameters at the middle of the longitudinal direction of the columnar crystals are measured by a transmission electron microscope.

EXAMPLES

Example 1

A coating film having the following composition was coated on a WC-10% Co (wt %) hard alloy base material having a shape of SNGN120416. The composition of the coating film was 0.5TiN-5.0TiCN-0.5TiCO-1.0Al$_2$O$_3$-0.1TiN ($\mu$m). The films other than the TiCN columnar crystal film were coated by general thermochemical vapor deposition. The TiCN films of the present products 1 to 10 were prepared by using a TiCl$_4$—H$_2$—C$_2$H$_6$—N$_2$ system by changing preparation conditions for each film. The TiCN film of a comparative product 1 was prepared by using a TiCl$_4$—H$_2$—Ar—CH$_3$CN system, and the TiCN films of comparative products 2 to 10 were prepared by using a TiCl$_4$—H$_2$—C$_2$H$_6$—N$_2$ system by changing preparation conditions for each film. The particle diameters of the TiCN films of the prepared samples and the numbers of thermal cracks caused by a milling cutter test are shown in Table 1.

Conditions for milling cutter testing

Material to be cut: SCM440

Shape of sample chip: SNGN120416

Cutting speed: V=150 m/min

Feed: f=0.35 mm/Tooth

Cutting depth: d=2.0 mm

Water-soluble cutting oil: not used

The numbers of thermal cracks appearing on the cutting faces of the samples at 40 passes were measured.

TABLE 1

Particle diameters, diameters of agglomerations and numbers of thermal cracks of TiCN films of columnar crystal structures

| | Ratio of particle diameter of crystal particles A/particle diameters of crystal particles B | Crystal particle diameter of columnar crystal A ($\mu$m) | Crystal particle diameter of columnar crystal B (agglomeration) ($\mu$m) | Average particle diameter of columnar crystal agglomerations ($\mu$m) | Average spacing between columnar crystal agglomerations B ($\mu$m) | Number of thermal cracks |
|---|---|---|---|---|---|---|
| Present product 1 | 3.3 | 0.23 | 0.75 | 4.5 | 18.5 | 2 |
| Present product 2 | 4.2 | 0.19 | 0.80 | 2.4 | 6.8 | 1 |
| Present product 3 | 4.3 | 0.21 | 0.90 | 3.6 | 5.8 | 1 |
| Present product 4 | 6.5 | 0.14 | 0.91 | 3.5 | 27 | 0 |
| Present product 5 | 7.5 | 0.10 | 0.75 | 3.3 | 5.2 | 1 |
| Present product 6 | 10.6 | 0.14 | 1.48 | 5.0 | 12.2 | 1 |
| Present product 7 | 14.8 | 0.04 | 0.59 | 2.1 | 3.2 | 0 |
| Present product 8 | 22.5 | 0.02 | 0.45 | 2.5 | 4.3 | 0 |
| Present product 9 | 25.3 | 0.04 | 1.01 | 4.5 | 16.4 | 2 |
| Present product 10 | 40.7 | 0.03 | 1.22 | 6.2 | 20.5 | 2 |
| Comparative product 1 | 1 (single) | 0.92 | — | — | — | 9 |
| Comparative product 2 | 60.6 | 0.05 | 3.03 | 12.5 | 20.1 | 9 |
| Comparative product 3 | 59 | 0.009 | 0.45 | 3.1 | 7.3 | 8 |
| Comparative product 5 | 2.2 | 0.41 | 2.40 | 9.2 | 25.2 | 9 |
| Comparative product 5 | 2.5 | 0.02 | 0.11 | 3.4 | 10.6 | 7 |
| Comparative product 6 | 63 | 0.24 | 10.35 | 35.5 | 110.1 | Defected at 29 passes |
| Comparative product 7 | 2.3 | 0.03 | 0.42 | 1.6 | 15.0 | 9 |
| Comparative product 8 | 1.9 | 0.11 | 0.62 | 350 | 180 | 9 |
| Comparative product 9 | 72.2 | 0.02 | 0.73 | 2.5 | 0.40 | 10 |
| Comparative product 10 | 1.7 | 0.10 | 0.88 | 8.1 | 520 | 10 |

* particle diameter of columnar crystal A < particle diameter of columnar crystal B Example 2

Present products 11 and 12 were prepared in the same manner as the present products 1 and 2 were prepared in Example 1 except that the shapes of base materials were changed. The present products 11 and 12 were subjected to a variety of shot peenings to prepare present products 13, 14 and 15. Samples were prepared in the same manner as the comparative products 1 and 2 were prepared in Example 1 except that the shapes of base materials were changed to prepare comparative products 11 and 12. The shot peenings were carried out by spraying hardened steels having an average particle diameter of 0.1 to 0.3 mm together with an air current of 10 to 120 m/s.

Evaluations were made by checking tool lives and the amounts of flank wear by the following cutting test.

Residual stresses were measured by X-ray diffraction (target: copper).

Conditions for cutting:

Conditions for peripheral intermittent cutting test

Material to be cut: S45C (with four U-shaped grooves)
Shape of sample chip: CNMG120408
Cutting speed: V=150 m/min
Feed: f=0.3 mm/rev
Cutting depth: d=2 mm
Water-soluble cutting oil: used

TABLE 2

Results of intermittent cutting test

| | Residual stress of base material* (Kg/mm$^2$) | Number of shocks (×10$^3$ times) | Number of thermal cracks |
|---|---|---|---|
| Present product 11 | −8 | 1 | 2 |
| Present product 12 | −12 | 2 | 1 |
| Present product 13 | −26 | 7 | 2 |
| Present product 14 | −52 | 12 | 1 |
| Present product 15 | −80 | 20 | 1 |
| Comparative product 11 | −10 | 1 | 9 |
| Comparative product 12 | −112 | 2 | 8 |

*A negative residual stress value indicates a compressive residual stress, and a positive residual stress value indicates a tensile residual stress.

As is understood from the results shown in Table 1, the invented products 1 to 10 had few thermal cracks despite the conditions for cutting under which thermal cracks were easily produced. To the contrary, the comparative examples 1 to 10 had many thermal cracks, or even chippings, because they had poor thermal shock resistance. As described above, the coated cutting tool of the present invention has improved thermal shock resistance by having such features that its coating film has a columnar crystal layer comprising at least one selected from the carbides, nitrides and carbonitrides of titanium, that the columnar crystal layer contains particles having crystal particle diameters in a direction horizontal to an interface between the hard coating film and a base material are large and particles having crystal particle diameters in the same direction are small and that the ratio of the average particle diameter of the large particles to the average particle diameter of the small particles is 3 to 50. The coated cutting tool having high thermal shock resistance which could not be achieved by prior arts was obtained by dispersing the agglomerations at predetermined spacings in the structure of the crystal layer.

Further, it was understood from the results of Example 2 in which the compressive residual stresses were applied that chipping resistance was significantly improved in addition to excellent thermal shock resistance, and excellent tool lives were obtained over an extremely wide range of cutting.

What is claimed is:

1. A coated cutting tool which comprises a base material of a hard alloy comprising a hard phase of tungsten carbide and at least one material selected from the group consisting of a carbide, a nitride and a carbonitride of a metal selected from the group consisting of the Group 4, 5 and 6 of the Periodic Table and a mutual solid solution thereof and a binder phase of at least one element selected from the group consisting of Fe, Ni and Co, and a hard coating film formed on the surface of the base material by a chemical vapor deposition method, wherein the hard coating film has a columnar crystal layer comprising at least one material selected from the group consisting of a carbide, a nitride and a carbonitride of titanium, the columnar crystal layer contains particles having crystal particle diameters in a direction horizontal to the interface between the hard coating film and the base material are large and particles having crystal particle diameters in the same direction are small, and the ratio of the average particle diameter of the large particles to the average particle diameter of the small particles is 3 to 50; and wherein the crystal particle diameters in the horizontal direction of the large particles are 0.4 to 10 $\mu$m, and the crystal particle diameters in the horizontal direction of the small particles are 0.01 to 0.25 $\mu$m.

2. The coated cutting tool according to claim 1, having agglomerations of the large particles, which have an average particle diameter of 2 to 200 $\mu$m, dispersed therein.

3. The coated cutting tool according to claim 2, where the agglomerations are apart from each other at a spacing of 0.5 to 200 $\mu$m.

4. The tool according to claim 1, wherein the hard phase of the coated base material has a residual compressive stress of 30 to 80 kg/mm$^2$.

5. The coated cutting tool according to claim 1, wherein a hydrocarbon gas mainly comprising ethane is used as a carbon element-feeding gas for forming the hard coating film.

6. The coated cutting tool according to claim 1, wherein the columnar crystal layer comprises titanium carbide.

7. The coated cutting tool according to claim 1, wherein the columnar crystal layer comprises titanium nitride.

8. The coated cutting tool according to claim 1, wherein the columnar crystal layer comprises titanium carbonitride.

* * * * *